United States Patent [19]

Ohmi et al.

[11] Patent Number: 5,660,694

[45] Date of Patent: Aug. 26, 1997

[54] FILM FORMING METHOD

[75] Inventors: Tadahiro Ohmi, 1-17-301 Komegabukuro 2-chome, Aoba-ku, Sendai-shi, Miyagi-ken 980; Tadashi Shibata, Sendai; Hiroaki Uetake, Sendai; Kazuhisa Miyashita, Sendai, all of Japan

[73] Assignee: Tadahiro Ohmi, Miyagi-ken

[21] Appl. No.: 505,247

[22] PCT Filed: Feb. 24, 1994

[86] PCT No.: PCT/JP94/00293

§ 371 Date: Oct. 16, 1995

§ 102(e) Date: Oct. 16, 1995

[87] PCT Pub. No.: WO94/19509

PCT Pub. Date: Sep. 1, 1994

[30] Foreign Application Priority Data

Feb. 24, 1993 [JP] Japan ................................. 5-35762

[51] Int. Cl.$^6$ ................................................. C23C 14/34
[52] U.S. Cl. ................... 204/192.12; 204/192.17; 204/192.25
[58] Field of Search .................... 204/192.12, 192.15, 204/192.17, 192.25, 298.08

[56] References Cited

U.S. PATENT DOCUMENTS

| 4,496,450 | 1/1985 | Hitotsuyanagi et al. | 204/192.15 |
| 4,824,546 | 4/1989 | Ohmi | 204/298.08 |
| 4,874,494 | 10/1989 | Ohmi | 204/192.12 |

FOREIGN PATENT DOCUMENTS

| 61-183471 | 8/1986 | Japan | 204/192.12 |
| 63-49751 | 10/1988 | Japan | 204/192.15 |

Primary Examiner—Aaron Weisstuch
Attorney, Agent, or Firm—Marshall, O'Toole, Gerstein, Murray & Borun

[57] ABSTRACT

The present invention provides a film forming method and apparatus which are capable of continuously changing the density or composition in the direction of film thickness of a deposited film, and which are capable of obtaining high quality films in a stable manner.

A film forming method in which a target material and a substrate are respectively disposed on first and second electrodes provided within a vacuum chamber, a gas which causes chemical vapor deposition and which sputters the target material is introduced into the chamber, high frequency powers having different frequencies are applied to the first and second electrodes, and a plasma is generated, and thus a deposition film is formed on a substrate; characterized in that by means of conducting film formation while controlling the DC potential of the target, a deposition film containing at least one kind of atom among the atoms constituting the target material and at least one kind of atom among the atoms constituting the chemical vapor deposition gas is formed on the substrate.

6 Claims, 6 Drawing Sheets

FILM FORMING METHOD

TECHNICAL FIELD

The present invention relates to a film forming apparatus. In greater detail, the present invention relates to a film forming method for simultaneously conducting chemical vapor deposition and sputtering and forming a film, and to a film forming apparatus.

BACKGROUND ART

The coating of thin films on the surfaces of parts or elements, and the provision of predetermined functions, is often conducted in an extremely wide range of fields, such as electric and electronic parts, tools, machine parts, and the like. Semiconductor devices such as integrated circuits and the like are representative thereof; such devices are produced by repeated film formation and minute working, so that film forming apparatuses play an extremely important role in the manufacturing processes thereof.

Figure 9:
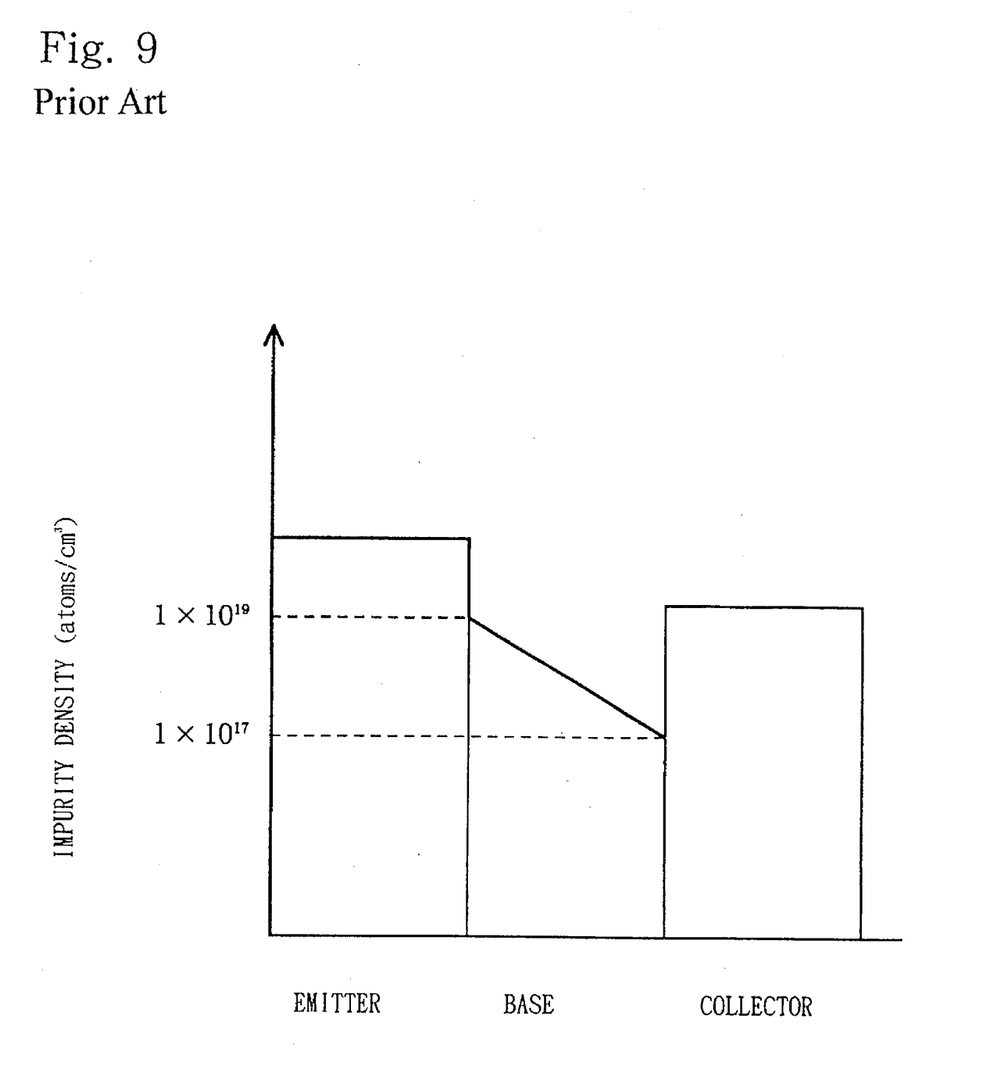
FIG. 9 is a graph showing the impurity density distribution in the emitter, the base, and the collector of a transistor.

Furthermore, in integrated circuits, in concert with the miniaturization of the devices, higher performance and quality are required, and for this reason, there has been a strong demand for a film forming method which is capable of forming, according to design, the impurity distribution in deposition films comprising the devices. For example, in the case of a bipolar transistor, the high speed characteristics of LSI, such as high speed operating elements, memory, digital/analog converters, and the like, or of elements which are extremely widely employed as discrete elements, are determined by how fast electrons pass through the base layer, so that a structure in which the base layer is made thinner and the passage distance is reduced, a gradient is created in the impurity concentration in the thin base layer and an internal electric field is formed, and which is capable of accelerating the electrons and exhibits a sharp impurity density change at the interface, for example, an impurity density distribution having a gradient such as that shown in FIG. 9, is effective in increasing element performance.

Conventional film forming apparatuses can be broadly divided into two groups based on the operating principle of the film forming method. That is to say, such apparatuses can be classified into film forming apparatuses which employ physical methods such as vapor deposition, sputtering, and the like, and film forming apparatuses which employ chemical reactions of film forming raw material gases, or the so-called chemical vapor deposition (CVD) methods. Such apparatuses have superior operability, simplicity of maintenance, high operation rates, and the stability of the quality is also superior, so that such apparatuses are widely employed; however, it is difficult to change the impurity density of the deposition film described above or the component ratio, and furthermore, it is difficult to form sharp changes in impurity density.

For example, when the impurity density of the deposition film or the component ratio is changed by means of vapor deposition or sputtering, it is necessary to change the impurity density or component ratio of the vapor deposition materials or the target materials themselves in correspondence with the impurity density of the deposited film or the component ratio. Furthermore, when aluminum silicide used as the wiring material of the semiconductor integrated circuit is formed by means of sputtering, it is necessary that the target have the precisely appropriate combination of aluminum and silicon. In addition, when deposition films having differing component ratios are formed, it is necessary to change the target each time to one which is appropriate for the composition of the deposition film. However, the impurity density or component ratio in the direction of depth of films deposited using standard film forming apparatuses is as shown in FIG. 8(a), and is constant in the direction of depth.

Figure 8:
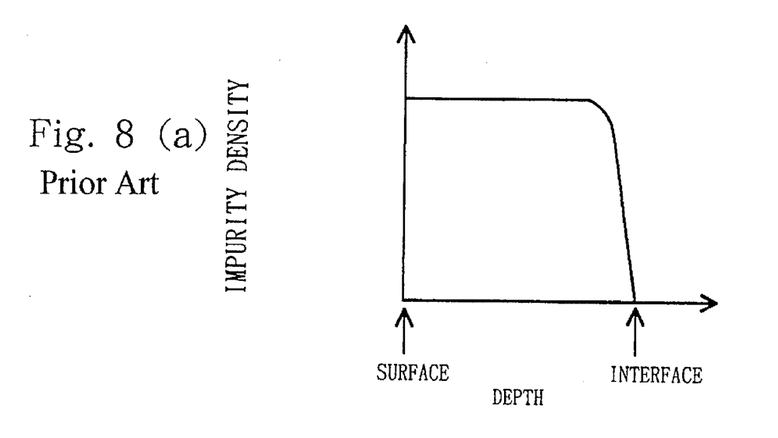
FIG. 8 is a graph showing the distribution of the impurity density in a prior art deposition film.

When attempts are made to control the impurity density or component ratio in the direction of depth as, for example, in FIG. 8(b), as a continuous function of the direction of depth (in the Figure, a straight-line relationship), such control is extremely difficult using vapor deposition or sputtering methods, so that as an approximating measure, as shown in FIG. 8(c), it is necessary to divide the depth into a number of regions n (in the Figure, n=4), and to change the impurity density or component ratio in a stepped manner. In order to do this, it is necessary to prepare a number of appropriate vapor deposition materials or targets in advance, as described above, and to interchange these at standard film thicknesses and thus to conduct film formation; however, as the number of divisions increases, the process becomes cumbersome, and it is thus not a practical method.

Furthermore, attempts have been made using the CVD method to form impurity density distributions within deposition films by means of continuously changing the ratio of the flow rates of the raw material gases during film deposition; however, in the case for example in which a p-type silicon layer is formed, the $B_2H_6$ gas is normally diluted to within a range of 100 ppm–2% in order to maintain the stability thereof, so that in order to alter the impurity density in the deposition film, it is necessary to greatly alter the ratio of the flow rate thereof with that of the $SiH_4$ gas, and as a result (the total flow rate changes) the discharge state changes, and the quality of the deposition film in the direction of layer thickness changes in an undesirable manner.

Additionally, in order to form a high-quality deposition film using a conventional CVD method, it was necessary to conduct film formation, for example in the case of monocrystalline silicon, at a high temperature within a range of 900°–1100° C., and furthermore, even in the case of polycrystalline silicon, the film was formed at a temperature within a range of 550°–600° C. by means of a reduced-pressure CVD method, so that a redistribution of the impurity atoms occurred as a result of thermal dispersion, and it is currently the case that the desired impurity density distribution cannot be obtained. Furthermore, attempts have been made to form the deposition film by means of a PCVD method; however, in order to form a high-quality film, annealing is necessary at a temperature of approximately 700° C., and this causes a problem in that a redistribution of the impurity atoms is caused.

As described above using conventional film forming methods and film forming apparatuses, it is currently extremely difficult to accurately control the density and composition in the direction of depth of the deposition film while maintaining the quality of the deposition film.

In view of the above circumstances, it is an object of the present invention to provide a film forming method and a film forming apparatus which are capable of continuously changing the density or composition in the direction of film thickness of a deposition film, and which are capable of obtaining a high quality film in a stable manner.

SUMMARY OF THE INVENTION

The film forming method in accordance with the present invention is a film forming method in which target materials and substrates are disposed at first and second electrodes provided within a vacuum chamber, a gas which causes chemical vapor deposition and which sputters the target material is introduced into the vacuum chamber, high frequency powers having different frequencies are applied to the first and second electrodes, respectively, and a plasma is generated, and thus a deposition film is formed on a substrate; characterized in that by means of conducting film formation while controlling the DC potential of the target, a deposition film containing at least one kind of atom among the atoms constituting the target material and at least one kind of atom among the atoms constituting the gas is formed on the substrate.

In the present method, it is preferable that the gas which causes the chemical vapor deposition and which sputters the target contain a gas which causes chemical vapor deposition by means of plasma excitation and an inert gas, and furthermore, it is desirable that film formation be conducted while changing the ratio of the respective flow rates.

Furthermore, it is preferable that the DC potential of the target material be controlled by changing the frequency of the high frequency power which is applied to the first electrode, and/or that the DC potential of the target material be controlled by a DC power source which is connected to the target material.

Furthermore, it is preferable that the substrate temperature be 400° C. or less.

The film forming apparatus in accordance with the present invention comprises a vacuum chamber having an inlet port for a gas used to cause chemical vapor deposition and sputter a target material, at least two electrodes provided within the vacuum chamber, a means for supporting the target material and a substrate on the first and second electrodes, and two high frequency power sources having different frequencies and connected to the first and second electrodes.

Furthermore, the high frequency power source connected to the first electrode is characterized in that the frequency thereof is variable, and/or a DC power source which is capable of controlling the DC potential of the target material is connected to the target material.

In the present invention, in a vacuum chamber, a target is disposed on a first electrode, high frequency power is applied to the first electrode, a film forming gas which sputters the target material is subjected to plasma excitation, and chemical vapor deposition and sputtering are simultaneously conducted, and thereby, a deposition film containing a desired density distribution of the atoms constituting the film forming gas and the target material is formed on the substrate which is supported on the second electrode.

By applying high frequency power having different frequencies to the first and second electrodes, it is possible to form a high quality monocrystalline film or polycrystalline film at low temperatures, and furthermore, as a result of processing at low temperatures, the thermal dispersion of the component atoms in the film is prevented, and it is possible to form a film having a desired impurity density or component ratio distribution.

Additionally, by means of applying a DC potential directly to the substrate from a DC power source, and/or by altering the frequency of the high frequency power which is applied to the first electrode, it is possible to control the energy of the ions impacting the target and to alter the sputtering rate. Furthermore, by means of changing the flow rate of the components which cause chemical vapor deposition of the film forming gas, it is possible to control the chemical vapor deposition rate. However, it is preferable that the total flow rate of the film forming gas in such a case be made constant. As a result, it becomes possible to freely change in a continuous manner the density or ratio of the target components within the deposition film.

DETAILED DESCRIPTION AND BEST MODE FOR CARRYING OUT THE INVENTION

Hereinbelow, the present invention will be explained in detail using embodiments.

EMBODIMENT 1

Figure 1:
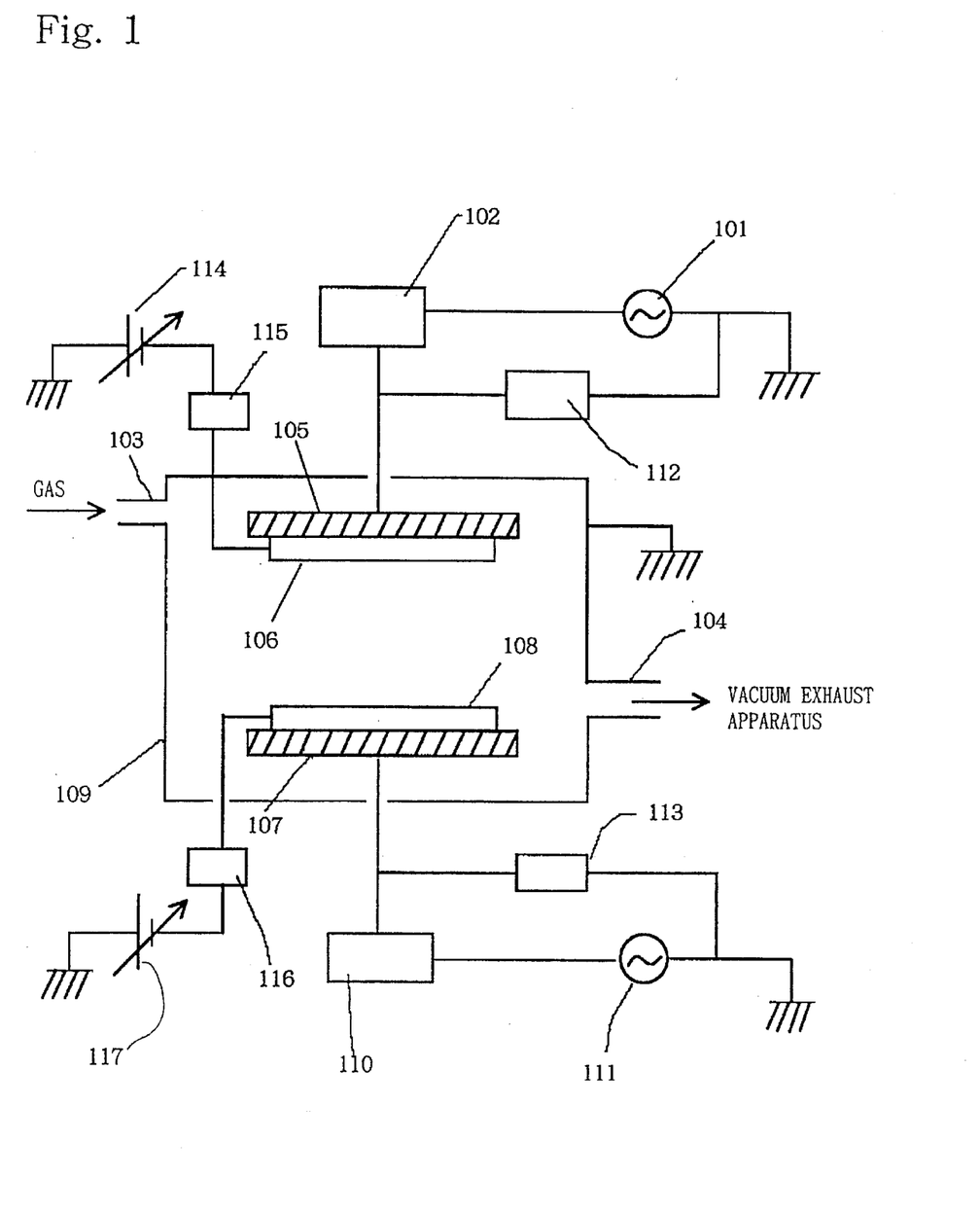
FIG. 1 is a schematic type diagram of the film forming apparatus in accordance with the first embodiment.

In FIG. 1, reference numeral 109 indicates a chamber, the pressure of which can be reduced; the material thereof is, for example, SUS316L, and the inner surfaces thereof are subjected to electrolytic polishing and oxide passivation processing, and the chamber is formed in the shape of a hollow box, one side of which measures 300 mm. Reference numeral 104 indicates a vacuum exhaust port for placing the chamber 109 in a vacuum state; this is connected with a vacuum exhaust apparatus. A turbo-molecular pump is employed as the vacuum exhaust apparatus.

Reference numeral 101 indicates a high frequency generating apparatus having a frequency of, for example, 200 MHz, and this is connected to the upper electrode 105. Reference numeral 102 indicates the high frequency matching circuit thereof.

Reference numeral 103 indicates a gas inlet port for introducing film forming gas; the material thereof is, for example, SUS316L, and the inner surfaces thereof are subjected to electrolytic polishing and oxide passivation processing, and the diameter thereof is ¼ inch.

Argon gas and monosilane gas are examples of the film forming gases; these are supplied from gas supply sources which are not shown in the Figure; they pass through gas supply piping, are mixed during this passage, and are introduced into gas inlet port 103.

Reference numerals 105 and 107 indicate, respectively, the upper electrode and lower electrode; the material thereof is, for example, SUS316L, and the surfaces thereof are subjected to electrolytic polishing and passivation processing, and in the present embodiment, electrodes having a diameter of 6 inches are employed. Reference numeral 106 indicates a target which is supported on the upper electrode 105; an n-type silicon wafer having a diameter of 5 inches is employed. Reference numeral 108 indicates a substrate which is supported on lower electrode 107; a p-type silicon wafer having a diameter of 5 inches is employed.

Reference numeral 111 indicates a high frequency generating apparatus having a frequency of 35 MHz; this is connected to lower electrode 107. Reference numeral 110 indicates the high frequency matching circuit thereof. Reference numeral 113 indicates a band pass filter comprising a coil and a capacitor; with respect to the 200 MHz high frequency power applied to the upper electrode 105, this short-circuits the lower electrode 107. Reference numeral 112 indicates a band pass filter comprising a coil and a capacitor; with respect to the 35 MHz high frequency power applied to the lower electrode 107, this short-circuits the upper electrode 105. Reference numeral 114 indicates a DC power source which is connected to target 106 and which is capable of controlling the DC potential thereof. Reference numeral 117 indicates a DC power source which is connected to substrate 108 and which is capable of controlling the DC potential thereof. Reference numeral 115 indicates a low pass filter comprising a coil and a capacitor; this serves to ensure that the high frequency power applied to target 106 is not transmitted to DC power source 114. Furthermore, reference numeral 116 also indicates a low pass filter comprising a coil and a capacitor; this serves to ensure that the high frequency power applied to substrate 108 is not transmitted to DC power source 117.

Next, an example will be explained in which, in a film deposited using this film forming apparatus, the dopant density in the direction of depth was controlled.

First, a p-type silicon wafer 108 is conveyed from a sealed chamber (not shown in the Figure) coupled with the vacuum chamber 109 via a gate valve (not shown in the Figure), and this is set on the lower electrode 107. Next, argon gas and monosilane gas are introduced into the vacuum chamber 109 from the gas inlet port 103, a 200 MHz high frequency power of 200 W is applied to the upper electrode 105 by means of the high frequency generating apparatus 101, and a plasma is generated within the vacuum chamber 109. At this time, the self-bias generated in the n-type silicon wafer 106 supported on the upper electrode 105 is approximately −10 V with respect to ground, and in this state, the irradiation energy of the argon ions is low, so that the n-type silicon wafer 106 is not caused to sputter.

Furthermore, the p-type silicon wafer 108 is heated to, for example, a temperature of 300° C. by means of a heater (not shown in the Figure). In order to obtain a high-quality film at such low temperatures, it is necessary to activate the substrate surface by means of the irradiation energy of the argon ions, and to cause sufficient migration of the film formation atoms which reach the substrate surface. At this time, if the irradiation energy of the argon ions is excessive, the crystalline nature of the substrate surface will break down, and a high-quality film will be unobtainable, and furthermore, if this energy is insufficient, it will be impossible to cause sufficient migration of the film formation atoms which reach the substrate surface, so that it is impossible to form a high-quality film. In the present embodiment, in order to obtain a high-quality film at low temperatures, a 35 MHz high frequency power of 20 W is applied to the lower electrode 107 by means of the high frequency generating apparatus 111, and a self-bias with respect to the ground of +10 V is applied to the p-type silicon wafer, so that an appropriate ion irradiation energy is obtained.

Figure 2:
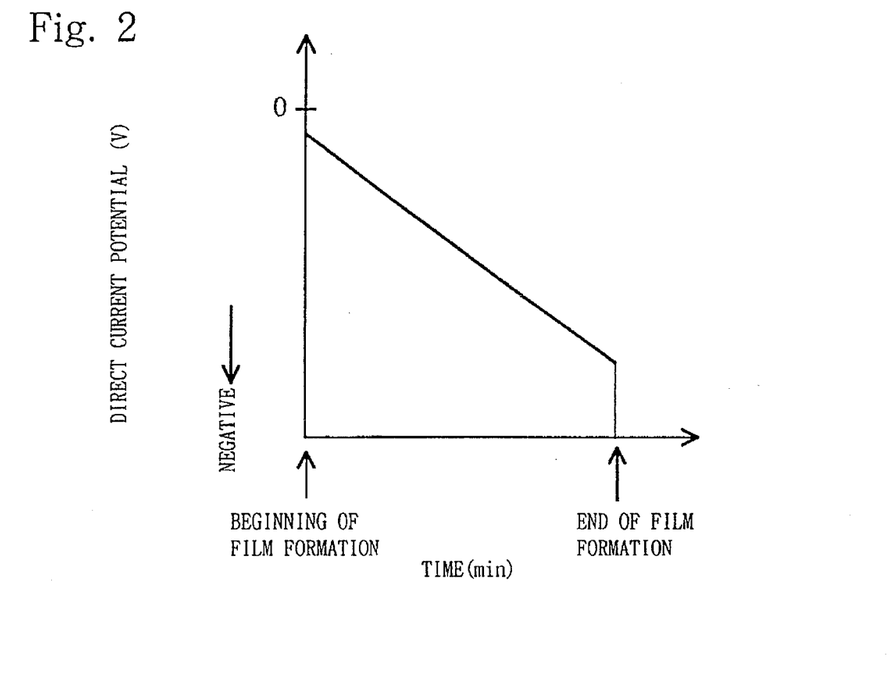
FIG. 2 relates to the first embodiment and shows a graph indicating the DC potential applied to an n-type silicon wafer during film formation.

In the present embodiment, when the monosilane gas is dissociated by means of the plasma and silicon is deposited on the p-type silicon wafer 108, when the DC potential of the n-type silicon wafer 106 is changed in the manner shown in FIG. 2 using the DC power source 114 which is connected to the n-type silicon wafer 106 supported on the upper electrode 105, the n-type silicon wafer 106 is caused to sputter by the argon ions in the plasma, and film formation by means of chemical vapor deposition and film formation by means of sputtering simultaneously occur, so that a film containing n-type impurity atoms is formed on the p-type silicon wafer 108.

Figure 3:
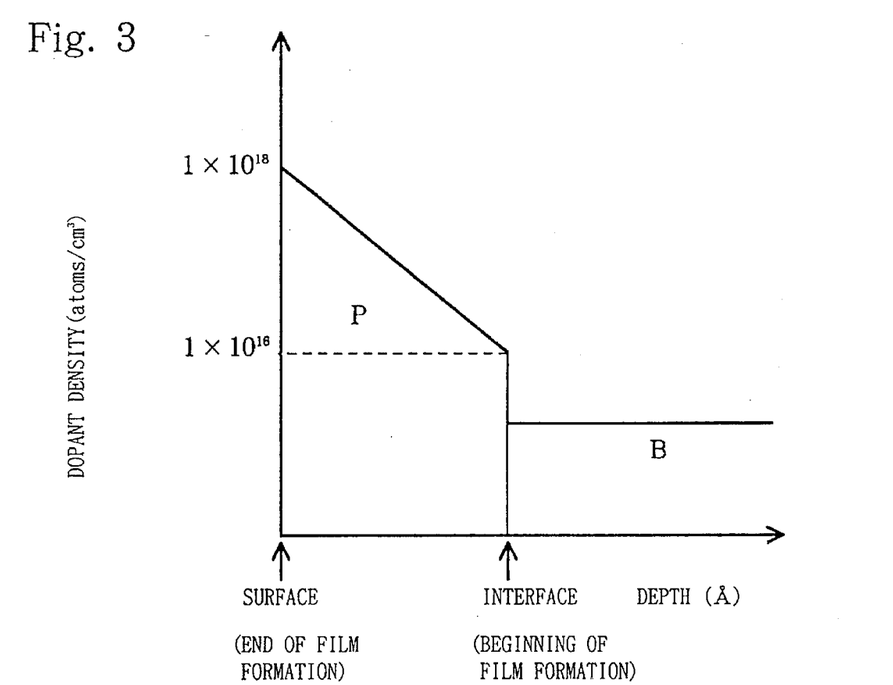
FIG. 3 relates to the first embodiment and shows a graph indicating the dopant density in the deposited film.

When the deposition film obtained in this manner was measured by the reflection high energy electron diffraction method, it was confirmed from the results thereof that this film was monocrystalline. The results of a measurement of the dopant density with respect to the direction of depth from the surface thereof by means of secondary ion mass spectroscopy are as shown in FIG. 3; it was confirmed that the film had a impurity density gradient with respect to the direction of depth.

Here, the reason why it is possible to control the impurity density distribution of the film deposited in the present embodiment in the direction of depth will be briefly explained. In general, plasmas have a positive potential $V_p$. This is termed the plasma potential. If the DC potential relating to the n-type silicon wafer 106 supported on the upper electrode 105 is represented by $V_{dc}$, then the argon ions in the plasma collide with the n-type silicon wafer 106 with an energy of $(V_p - V_{dc})$. As this energy increases, the number of component atoms of the n-type silicon wafer 106 which are released as a result of the impact increases, and accordingly, the deposition rate of the n-type silicon deposited on the p-type silicon wafer 108 which is supported on the lower electrode 107 increases. In general, the plasma potential $V_p$ changes very little, so that it is possible to control the deposition rate by means of sputtering by controlling $V_{dc}$.

On the other hand, in the present embodiment, in the chemical vapor deposition in which the monosilane gas is dissociated by means of the plasma and silicon is deposited on the p-type silicon wafer 108, the deposition rate is determined by the flow rate of the monosilane gas.

Additionally, by conducting film formation while controlling the deposition rate of the n-type silicon by means of sputtering by controlling the DC potential of the n-type silicon wafer 106 having a certain dopant impurity density by means of a DC power source 114 which is connected to the n-type silicon wafer 106, it is possible to freely control the dopant density of the deposition film in the direction of depth.

In the present embodiment, the flow rate of the film forming gas was made constant; however, depending on the qualities of the film which are required, it is possible to alter the ratio of the gas flow rates in the film forming gas, and to alter the ratio of the flow rates of the components which cause chemical vapor deposition, and thereby to cause a certain composition distribution in the deposition film. Furthermore, it is of course the case that both the DC potential of the target and the flow rates may be altered in combination.

In the present embodiment, in order to control the rate of deposition by means of sputtering, $V_{dc}$ was controlled by means of the DC power source 114 which was connected to the n-type silicon wafer 106 supported on the upper electrode 105; however, $V_{dc}$ may also be altered by means of the frequency of the high frequency power applied to upper electrode 105, so that the deposition rate by means of sputtering may also be controlled by means of controlling $V_{dc}$ by controlling this frequency. In particular, in the case where target 106 comprises an insulating material, it is impossible to control $V_{dc}$ by means of DC power source 114, so that control by means of the frequency of the high frequency power which is applied to the upper electrode 105 is effective.

Furthermore, in the present embodiment, with respect to the gas introduced from gas inlet port 103, argon gas was employed as an inert gas, and monosilane gas was employed as a gas causing chemical vapor deposition, and after these were mixed, the gases were introduced into the vacuum chamber from the inlet port 103; however, other gases, such as He, Ne, Kr, Xe, and the like, may be used as the inert gas, and furthermore, hydrides containing Si atoms or organic substances containing Si atoms such as, for example, $Si_2H_6$, $Si_3H_8$, and the like, may be employed as the gas which causes chemical vapor deposition. Any gas may be employed insofar as it is capable of being excited by a plasma and causing film formation by means of chemical vapor deposition and is capable of sputtering a target. Furthermore, separate inlet ports may be provided for each gas.

Furthermore, in the present embodiment, film formation was conducted using one type of material, for example, an n-type silicon wafer; however, where necessary, a material having a different composition may be conveyed from a sealed chamber coupled with the vacuum chamber 109 via a gate valve, and film formation may be conducted after exchanging these materials. By means of this, it is possible to freely alter the composition range within which control is possible in the film which is deposited.

In the present embodiment, in order to obtain a high-quality film at low temperatures, 35 MHz high frequency power was applied to the lower electrode 107 by the high frequency generating apparatus 111, and a self bias with respect to the ground of +10 V was applied to the p-type silicon wafer 108, and thereby an appropriate ion irradiation energy was obtained; however, other frequencies may be employed so long as the appropriate ion irradiation energy is obtainable. Furthermore, when the substrate 108 comprises a conductive material, an appropriate ion irradiation energy may be obtained using the DC power source 117 which is connected to the substrate 108, without employing high frequency power.

Additionally, in the present embodiment, the vacuum chamber 109, the gas inlet port 103, the upper electrode 105, and the lower electrode 107 all comprise, for example, SUS316L, and the inner surfaces or surfaces thereof were subjected to electrolytic polishing and oxide passivation processing; however, this is done so that the inner surfaces of the vacuum chamber will not be subject to damage resulting from sputtering as a result of the ions or corrosion even if exposed to the plasma, and depending on the use, other materials may be employed. Examples of other materials include, for example, SUS316L or aluminum which has been subjected to nickel-phosphorus plating and the exposed surfaces of which have been subjected to fluoride processing.

A turbo-molecular pump was employed as the vacuum exhaust apparatus; however, depending on the use, other types of vacuum pumps may be employed. Furthermore, an n-type silicon wafer having a diameter of 5 inches was employed as the target 106, while a p-type silicon wafer having a diameter of 5 inches was employed as the substrate 108; however, depending on the use, other materials or shapes may be employed.

Additionally, in the present embodiment, the frequency of the high frequency power which was applied to upper electrode 105 was 200 MHz; however, if it is possible to also control the DC potential applied to target 106 by means of the DC power source 114 connected to target 106, or by means of the frequency of the high frequency power applied to upper electrode 105, and thus to control the deposition rate by means of sputtering of the target 106 supported on the upper electrode 105, other frequencies may be employed.

In the present embodiment, the film formation of the deposition film was conducted by means of simultaneously subjecting the monosilane gas to plasma excitation and conducting chemical vapor deposition, and sputtering the n-type silicon wafer 106 supported on the upper electrode 105; however, it is possible to combine the film forming methods, so that, for example, film formation is at first conducted solely by means of chemical vapor deposition, and then chemical vapor deposition and sputtering are simultaneously conducted, or furthermore, film formation is conducted only by sputtering, or the like.

Furthermore, in the present embodiment, monocrystalline formation was conducted at low temperatures by means of controlling the DC potential of the substrate and thus obtaining the appropriate ion irradiation energy; however, depending on the use, the deposition film need not be monocrystalline.

Additionally, in the present embodiment, the sputtering of the n-type silicon wafer 106 supported on the upper electrode 105 and the plasma excitation of the monosilane gas and the chemical vapor deposition were simultaneously conducted, and film formation was conducted on the p-type silicon wafer supported on the lower electrode 107; however, depending on the intended use, during film formation, one or more further gases may be introduced into the vacuum chamber 109, these may be subjected to plasma excitation and caused to react with the atoms released as a result of the sputtering in the plasma, and these may be deposited, and film formation by means of chemical vapor deposition in which the raw material gas is subjected to plasma excitation may be simultaneously conducted, and film formation thus conducted.

EMBODIMENT 2

Next, a second embodiment of the present invention is described.

Figure 4:
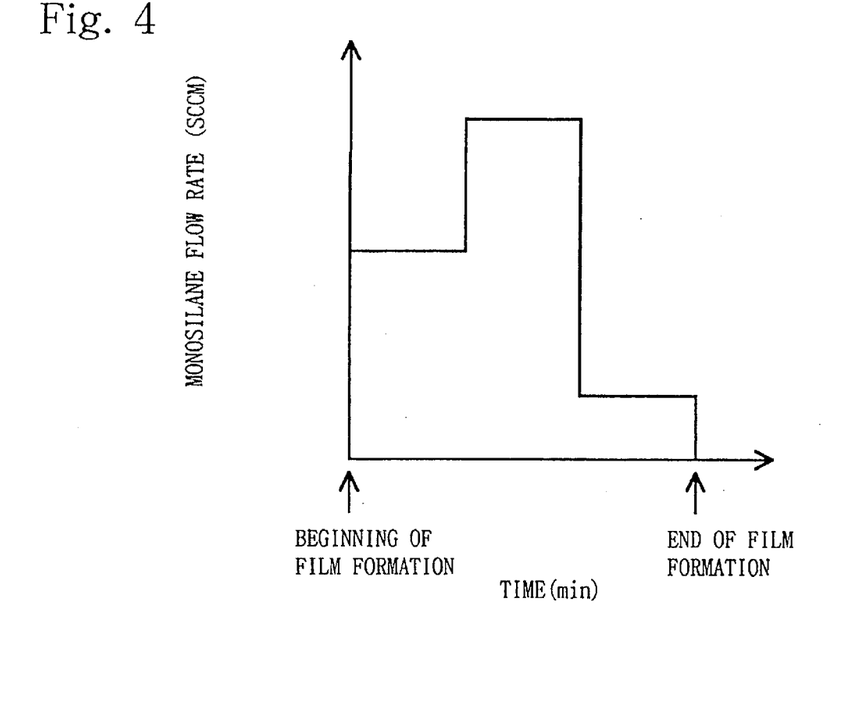
FIG. 4 relates to the second embodiment and is a graph showing the monosilane flow rate during deposition.
Figure 5:
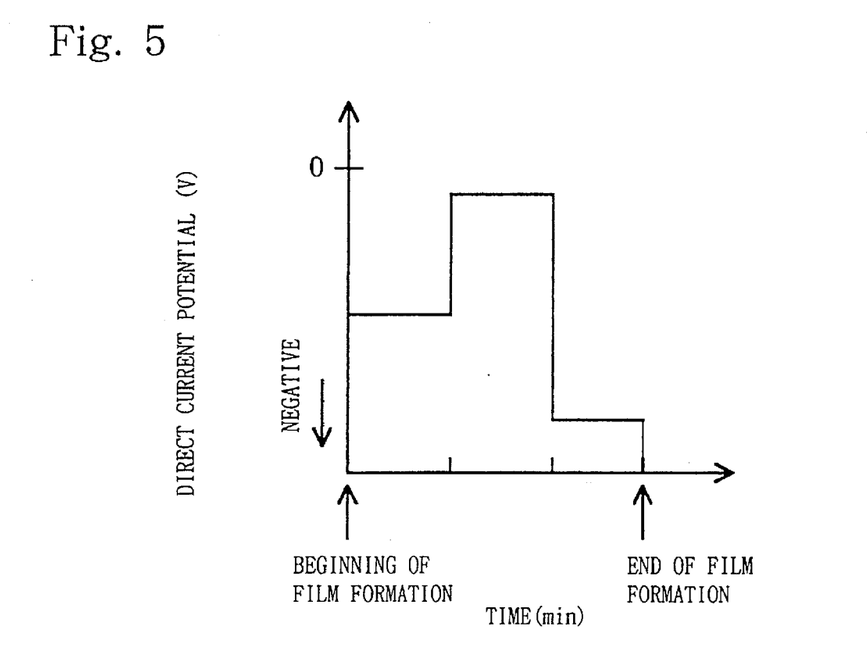
FIG. 5 relates to the second embodiment and is a graph showing variations of the DC potential applied to the n-type silicon wafer during deposition.
Figure 6:
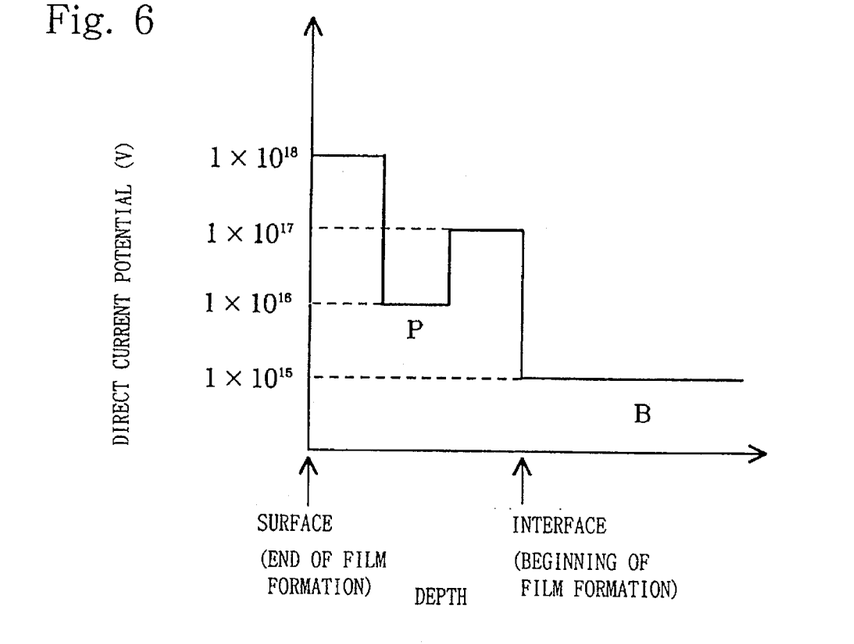
FIG. 6 relates to the second embodiment and shows a graph indicating the dopant density in the deposition film.

The present embodiment is one in which the flow rate of the monosilane gas introduced into the vacuum chamber 109 from the gas inlet port 103 is controlled as shown in FIG. 4, and furthermore, the DC potential of the n-type silicon wafer 106 is controlled as shown in FIG. 5 by means of the DC power source 114 which is connected to the n-type silicon wafer 106 supported on the upper electrode 105 (here, the total flow rate of the gas is made constant). The other details are identical to those in the first embodiment, so that a duplicate explanation thereof is omitted here. At this time, a monocrystalline silicon film is obtained in which the dopant density with respect to the direction of depth has the rectangular form shown in FIG. 6.

EMBODIMENT 3

A third embodiment of the present invention is described hereinbelow.

Figure 7:
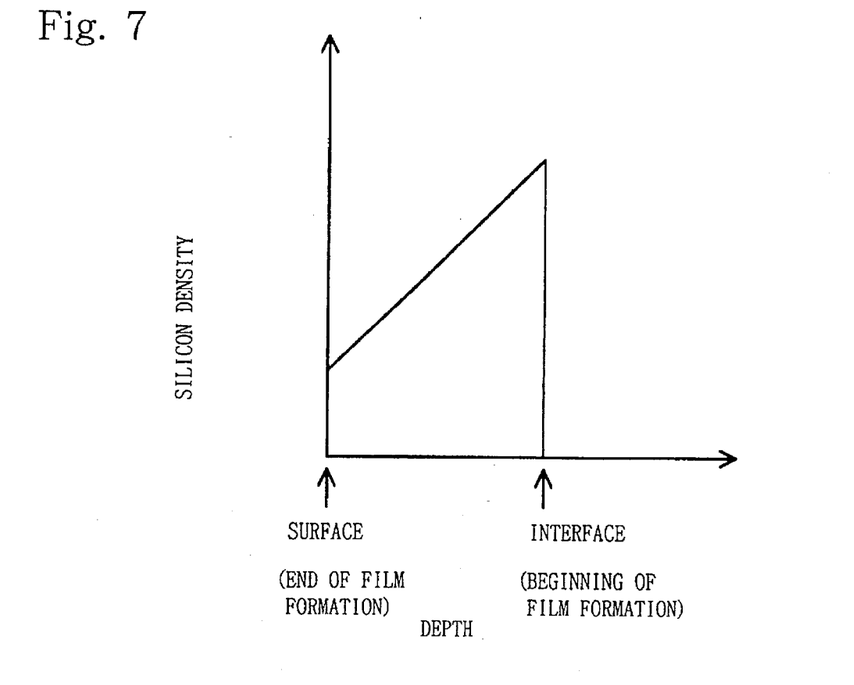
FIG. 7 relates to a third embodiment and shows a graph indicating the density of silicon in the aluminum of the deposition film.

The present embodiment is an example in which aluminum is used as the material 106 which is supported on the upper electrode 105. Other details are identical to those in the first embodiment, so that a duplicate explanation thereof will be omitted here. When the silicon density present in the aluminum in the deposition film with respect to the direction of depth was measured using secondary ion mass spectroscopy, it was found that the AlSi film which was obtained had a density distribution such as that shown in FIG. 7.

Industrial Applicability

By means of the present invention, it becomes possible to freely alter, in accordance with the design, the component distribution of a deposition film, so that it becomes possible to produce high-performance elements such as, for example, high speed bipolar transistors and the like.

We claim:

1. A film forming method comprising the steps of disposing a target material and a substrate on first and second electrodes provided within a vacuum chamber, introducing a gas for chemical vapor deposition which sputters said target material into said chamber, applying high frequency powers having different frequencies to said first and second electrodes and generating a plasma, and forming a deposition film on said substrate, wherein film formation is conducted while the DC potential of said target material is controlled, whereby a deposition film containing at least one kind of atom among the atoms constituting said target material and at least one kind of atom among the atoms constituting said gas is formed on said substrate.

2. A film forming method in accordance with claim 1, characterized in that the DC potential of said target material is controlled by changing the frequency of the high frequency power applied to said first electrode.

3. A film forming method in accordance with claim 1, characterized in that the DC potential of said target material is controlled by a DC power source connected to said target material.

4. A film forming method in accordance with claim 1, characterized in that the gas which causes said chemical vapor deposition and which sputters said target material contains a gas which causes chemical vapor deposition by means of plasma excitation and an inert gas.

5. A film forming method in accordance with claim 4, characterized in that the ratio of the flow rates of said gas causing chemical vapor growth and said inert gas is changed during said film forming.

6. A film forming method in accordance with claim 1, characterized in that the temperature of said substrate is 400° C. or less.

* * * * *